United States Patent [19]

Sadhir

[11] Patent Number: 4,618,507

[45] Date of Patent: Oct. 21, 1986

[54] METHOD OF MAKING A CAPACITOR WINDING

[75] Inventor: Rajender K. Sadhir, Plum, Pa.

[73] Assignee: Westinghouse Electric Corp., Pittsburgh, Pa.

[21] Appl. No.: 731,258

[22] Filed: May 7, 1985

[51] Int. Cl.$^4$ .................................................. B05D 3/06
[52] U.S. Cl. ........................................ 427/41; 427/40; 427/124
[58] Field of Search ...................... 427/38, 41, 40, 124

[56] References Cited

U.S. PATENT DOCUMENTS 4,479,369 10/1984 Sando et al. ................... 427/38 X
4,507,331 3/1985 Hiraoka ............................. 427/38

OTHER PUBLICATIONS

Thin Solid Films, 97 (1982) 17–29, Preparation of Metallic Organo Tin Films by Glow Discharge Polymerization and Their Properties.

Primary Examiner—Bernard D. Pianalto
Attorney, Agent, or Firm—R. D. Fuerle

[57] ABSTRACT

Disclosed is a method of making a capacitor winding by exposing a plasma polymerizable vapor of an organometallic compound to a plasma, moving a polymeric substrate beneath the plasma-exposed polymerizable organometallic vapor at a speed such that the metallic element in the organometallic vapors is deposited on the polymeric substrate to form a conducting layer, and carbon from the organic portion of the organometallic vapor is deposited on top of the conducting layer as a pinhole free highly cross-linked polymeric film. The substrate is then wound on a spool to form the capacitor winding.

Also disclosed is apparatus useful for making the capacitor winding which consists of a substantially gas-tight reactor, a pay-out spool containing a wound-up organic polymeric substrate, a take-up spool positioned so that the substrate can move from the pay-out spool to the take-up spool unimpeded, and means for moving the substrate from the pay-out spool to the take-up spool. A monomer inlet is provided for admitting a vaporous monomer into the reactor over the substrate as it moves from the pay-out spool to the take-up spool and an effluent outlet is provided for drawing gases out of the reactor. A valve controls the admission of the monomer to the inside of the reactor and a vacuum pump applies a vacuum to the effluent outlet. A pressure gauge measures the vapor pressure inside the reactor and a radio frequency generator generates a plasma over the substrate as it moves from the pay-out spool to the take-up spool.

17 Claims, 1 Drawing Figure

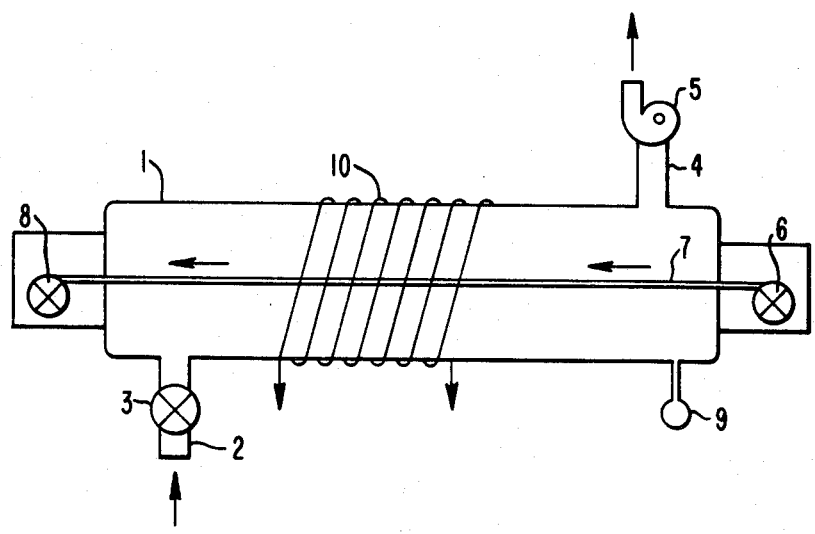

METHOD OF MAKING A CAPACITOR WINDING

BACKGROUND OF THE INVENTION

In the manufacture of capacitor windings, a conducting sheet and an insulating sheet are wound together to produce alternating layers of conductor and insulator. Separate sheets of metal conductor and polymeric insulator or a metalized film can be used.

The capacitance of a winding can be increased by using thinner dielectric films, but it is difficult to produce thin dielectric films that are pinhole free. Pinholes in the dielectric film will result in the conductance of the charge between adjacent layers of metal foil, resulting in a loss of capacitance.

SUMMARY OF THE INVENTION

We have discovered a method of forming a capacitor winding by simultaneously applying both a dielectric film and a metal film on a substrate. The dielectric films produced by the method of this invention are very thin yet can be made pinhole free. A variety of metals and dielectric materials can be deposited and the winding can be made in various widths and lengths.

DESCRIPTION OF THE INVENTION

The accompanying drawing is a schematic side view of a certain presently preferred embodiment of an apparatus according to this invention, that is useful in making a capacitor winding by the process of this invention.

In the drawing, there is disclosed a reactor 1 having a monomer inlet 2 controlled by valve 3, and an effluent outlet 4 to which is attached vacuum pump 5. Within reactor 1 is pay-out spool 6 on which a substrate 7 is wound. A motor or other means (not shown) propels substrate 7 from pay-out spool 6 to the take-up reel 8. A pressure gauge 9 indicates the vapor pressure inside the reactor, and an electrical coil 10 attached to a radio frequency (RF) power supply (not shown) generates a plasma within the reactor above the extended substrate.

The apparatus is operated in the following manner. The substrate material is moved very slowly from pay-out spool 6 to take-up reel 8. Organometallic monomer vapors are admitted to the reactor through monomer inlet 2 at a rate controlled by valve 3 and by the vacuum maintained within the reactor by means of a pump 5 attached to effluent outlet 4. The plasma generated by coil 10 results in the deposition of the metal element in the organometallic monomer on top of moving substrate 7 in the region near the monomer inlet 2. Carbon, hydrogen, and possibly some oxygen or other elements from the organometallic compound are deposited as a highly cross-linked polymer on the moving substrate in the region near effluent outlet 4. Since the substrate 7 is moving from pay-out spool 6 to take-up reel 8, the result is that the metal element is deposited as a metal film on top of a film of the highly cross-linked polymer. Thus, the substrate wound onto the take-up reel 8 will consist of alternating layers of dielectric and metal foil, and will be suitable for use as a capacitor winding.

In the apparatus, the monomer inlet 2 and the effluent outlet 4 can be reversed so that the monomer enters by outlet 4 and the effluent leaves by monomer inlet 2. If this arrangement is used, the metal film will be on the bottom and the insulating dielectric film will be on top rather than the reverse.

Organometallic monomers that are useful in this invention include those that have a vapor pressure of at least 100 millitorr (mT) at 50° C. The process of this invention is preferably conducted at room temperature and monomers which have lower vapor pressures must be heated in order to vaporize them, which results in excessive condensation of the monomers on the walls of the reactor. Organometallic monomers useful in this invention include, for example, organic compounds of the metals aluminum, iron, tin, copper, palladium, gold, silver, and nickel. The preferred organometallic compounds are organoaluminum compounds because aluminum is the metal most useful in forming capacitor windings. A preferred general formula for the organoaluminum compounds is $AlR_3$ where each R is independently selected from alkyl from $C_1$ to $C_4$ because these compounds have a high vapor pressure at 25° C. A particularly preferred organoaluminum compound is triisobutylaluminum, $Al(C_4H_9)_3$ because it has a high vapor pressure. Examples of monomers that can be used in this invention include triethoxyaluminum, $Al(OC_2H_5)_3$, triethylaluminum, $Al(C_2H_5)_3$, trimethylaluminum, $Al(CH_3)_3$, triethylaluminum etherate, $4Al(C_2H_5)_3.3(C_2H_5)_2O$, diethylaluminum chloride $(C_2H_5)_2AlCl$, dicyclopentadienylnickel, $(C_2H_5)_2Ni$, nickel dicarbonyl, $Ni(CO)_2$, iron penta carbonyl $Fe(CO)_5$, tetramethyl tin $Sn(CH_3)_4$, $Sn(C_2H_5)_4$, $Sn(C_4H_9)_4$, $Ge(CH_3)_4$, and $Zn(CH_3)_2$. Up to about 50% by volume of an optional carrier gas may be included with the monomer vapor to increase the amount of deposition on the substrate. However, it is preferable not to include a carrier gas with the monomer vapor as that may make it more difficult to produce quality films. Any inert gas, such as argon or nitrogen, can be used as a carrier gas.

The substrate can be any polymeric material from which a film can be formed. Suitable substrate materials include polysulfone, polypropylene, polyethylene, polyamides, polyvinylalcohol, and polyvinyl chloride. Particularly preferred as substrates are polysulfone and polypropylene as these polymers are widely used in making capacitors. The width and thicknesses of the substrate can vary widely but a typical width is about ¼ to about 2 inches and a typical thickness is about 1/10th to about 2 mils.

The plasma can be generated in a variety of ways passing a current through a coil or through one electrode at various frequencies such as radio frequency, microwave, or DC. Preferably, the plasma is generated by radio frequency as that has been found to work well and is necessitated for inductive coupling. A frequency range of 100 hertz (Hz) to about 1 gigahertz (gHz) is preferred for maximum effectiveness.

In the process of this invention, the pressure within the reactor should be maintained at about 50 to about 100 mT. Lower pressures result in insufficient deposition, and higher pressures may produce a poor product. This range of pressure can be maintained by means of valve 3 at momomer inlet 2 of reactor 1, and by means of the degree of vacuum applied to the effluent outlet 4.

In this invention, preferably neither the monomer is heated to vaporize it nor is the substrate heated. Thus, substrates can be used that are heat sensitive and would be damaged if they were heated. Also, by not heating the substrate, damage to the winding that may occur because the metal and the dielectric having different coefficients of thermal expansion, is prevented.

The substrate speed in the reactor will depend upon the rate at which the metal and the dielectric are deposited upon it. If the substrate moves at too great a speed, it will be incompletely covered with the metal foil and with the dielectric. On the other hand, if it moves at too slow a speed, the dielectric will be excessively thick, and the metal and dielectric may be mixed together. A suitable speed is generally between one inch and one foot per minute.

The process of this invention can be operated as a batch process, producing a single capacitor winding at a time, or it can be run as a continuous process, where many capacitor windings are made from a large spool of substrate. The process can also be used to make other articles, such as, for example, circuit boards, where the substrate is masked prior to the deposition process.

The following examples further illustrate this invention.

EXAMPLE

An inductively coupled tubular reactor can be used to deposit conducting and insulating films simultaneously at different places in the reactor. The substrates, (glass slides, Mylar (polyethylene terephthalate), or and polysulfone film can be placed at different positions in the reactor. In a typical polymerization reaction, the various substrates can be kept inside the glass sleeves and the glass sleeves can be inserted inside the reactor. The reactor can be evacuated to less than 5 microns pressure by using a roughing pump in conjunction with a liquid nitrogen trap. The monomer (trimethyl aluminum) vapors can be allowed to flow into the reactor through the leak valve. The flow rate of the monomer can be adjusted by determining the increase in pressure in a fixed time and calculating the flow rate by using the standard gas equation. The typical pressure for conducting and insulating film deposition can be 50 to 60 microns. The r.f. discharge can be applied at a power level of 25 to 30 watts. The reaction can be continued for a fixed time and the rate of film deposition can be determined by finding out the thickness of the films at various positions in the reactor and dividing that by the time of the reaction.

The sheet resistivity of the plasma ploymerized organo-aluminum films can be determined by a four probe method, and the resistivity can be calculated by using the equation:

$$\rho = \frac{V}{I} \cdot w \cdot \frac{\pi}{\ln 2}$$

where:
$\rho$ = sheet resistivity (ohm—cm)
V = voltage (volts)
w = thickness of film (cm)
$\pi/\ln 2$ = constant 4.5234

Using this method we can deposit the conducting films closer to the monomer inlet port (i.e., the place of maximum r.f. flux density) and the insulating films at the farthest place in the reactor from the monomer inlet port.

I claim:

1. A method of depositing conducting and polymeric films on a substrate comprising:
   (A) exposing a plasma polymerizable vapor, selected from the group consisting of organometallic compounds and mixtures thereof with inert carrier gas, to a plasma; and
   (B) moving a substrate, which is in the form of a film, beneath said plasma-exposed polymerizable organometallic vapor at a speed such that the metallic element in said organometallic vapor is deposited on said substrate as a conducting film, and carbon from said organic portion of said organometallic vapor is deposited on said conducting film as a pinhole-free highly-cross-linked polymeric film.

2. A method according to claim 1 including the additional step of winding said substrate to form a capacitor winding.

3. A method according to claim 1 wherein said organometallic compound has a vapor pressure at 50° C. of at least 100 mT.

4. A method according to claim 1 wherein said organometallic compound has the general formula:

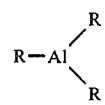

where each R is independently selected from alkyl from $C_1$ to $C_4$.

5. A method according to claim 1 wherein said substrate is at room temperature.

6. A method according to claim 1 wherein said organometallic vapor is at room temperature.

7. A method according to claim 1 wherein the vapor pressure of said organometallic vapor is about 50 to about 100 mT.

8. A method according to claim 1 wherein said substrate is polymeric.

9. A method according to claim 8 wherein said substrate is selected from the group consisting of polysulfone, polypropylene, polyethylene, polyamide, polyvinyl alcohol, and polyvinyl chloride.

10. A method according to claim 9 wherein said substrate is polypropylene.

11. A method according to claim 1 wherein said substrate is about ¼ to about 2 inches wide and about 1/10 to about 2 mils thick.

12. A method according to claim 1 wherein the speed of said substrate is about 1 inch to about 1 foot per minute.

13. A method according to claim 1 wherein said plasma is generated by radio frequency at 100 Hz to 1 gHz.

14. A method according to claim 1 wherein said conducting film is deposited first on said substrate, and said polymeric film is deposited on top of said conducting film.

15. A method according to claim 1 wherein said polymer film is deposited first on said substrate, and said conducting film is deposited on top of said polymeric film.

16. A capacitor made according to the method of claim 1.

17. A method according to claim 1 wherein said organometallic compound is selected from the group consisting of triisobutylaluminum, triethoxyaluminum, triethylaluminum, trimethylaluminum, triethylaluminum etherate, diethylaluminum chloride, dicyclopentadienylnickel, nickel dicarbonyl, iron penta carbonyl, and mixtures thereof.

* * * * *